United States Patent [19]

Thompson et al.

[11] 4,048,521
[45] Sept. 13, 1977

[54] FLIP-FLOP WITH FALSE TRIGGERING PREVENTION CIRCUIT

[75] Inventors: Francis T. Thompson, Murrysville; Michael B. Brennen, Pittsburgh, both of Pa.

[73] Assignee: Westinghouse Electric Corporation, Pittsburgh, Pa.

[21] Appl. No.: 705,301

[22] Filed: July 14, 1976

Related U.S. Application Data

[63] Continuation of Ser. No. 535,626, Dec. 23, 1974, Pat. No. 3,989,999.

[51] Int. Cl.² ............................................. H03K 3/286
[52] U.S. Cl. .................................... 307/291; 307/246; 307/234
[58] Field of Search ................... 307/247 R, 291, 292, 307/246, 234, 208; 328/167

[56] References Cited

U.S. PATENT DOCUMENTS

| | | | |
|---|---|---|---|
| 3,225,221 | 12/1965 | Scott | 307/292 |
| 3,327,134 | 6/1967 | Keane | 307/247 R |
| 3,349,255 | 10/1967 | McAvoy | 307/292 |

*Primary Examiner*—John S. Heyman
*Attorney, Agent, or Firm*—M. J. Moran

[57] ABSTRACT

A set-reset flip-flop is taught utilizing NAND gate logic elements and an internally connected resistor-capacitor circuit. The time constant of the resistor-capacitor network is such that valid triggering pulses for the input terminal of the flip-flop will not be propagated through the flip-flop to change the output state thereof unless the pulses are of a minimum duration. The duration of such pulses are chosen to be significantly larger than the duration of expected random noise which may appear on the input terminal of the flip-flop. Such being the case, noise signals are not propagated through the flip-flop to change the state thereof. A discharge network is provided for the capacitor to quickly discharge the capacitor at the termination of each input pulse, whether noise or triggering, so that an accummulaton of noise pulses will not cause a shift in the output of the flip-flop.

4 Claims, 1 Drawing Figure

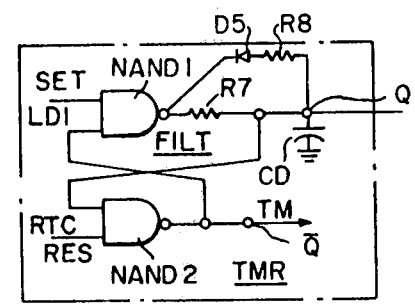

ns of the same signal to the same terminal will
FLIP-FLOP WITH FALSE TRIGGERING PREVENTION CIRCUIT This is a continuation division of application Ser. No. 535,626, filed Dec. 23, 1974 now U.S. Pat. No. 3,989,999.

CROSS REFERENCE TO RELATED APPLICATIONS

Certain inventions related to those disclosed in the present application are disclosed and claimed in U.S. Pat. No. 3,999,117 filed concurrently herewith by L. Gyugyi and M. B. Brennen; U.S. Pat. No. 3,987,360 filed concurrently herewith by M. B. Brennen and F. T. Thompson; U.S. Pat. No. 3,987,359 filed concurrentLy herewith by F. T. Thompson; U.S. Pat. No. 4,000,455 filed concurrently herewith by L. Gyugyi and F. T. Thompson and U.S. Pat. No. 4,001,671 filed concurretly herewith by L. Gyugyi, M. B. Brennen and A. J. Stacey, all of which are assigned to the same assignee as the present application.

BACKGROUND OF THE INVENTION

THis invention is related generally to flip-flop circuits and is related more specifically to set-reset flip-flops using logic elements and time delay means.

Set-reset flip-flop circuits are known. They generally comprise analog devices interconnected with combinations of resistors and capacitors of digital gates interconnected with combinations of resistors and capacitors. In typical flip-flop operation there are two input terminals and two output terminals. One input terminal is called a "set" input and the other input terminal is called a reset input. Typically the output terminals are complementary, that is, when one is at a high voltage state other of necessity is at a low voltage state. By supplying a trigger signal to an appropriate input terminal, the two output terminals of the flip-flop will reverse voltage states provided the input signal had attained a proper voltage level to begin with. Furthermore, subsequent provisions of the same signal to the same terminal will not cause a further shift in the status of the outputs of the flip-flop unless an intervening signal is supplied to the other input terminal. In the case of a digital flip-flop an input terminal actuated by providing a digital "one" level thereto. The provision of a digital "zero" level will not cause a shift in states of the outputs of the flip-flop. Typically interconnecting latching circuitry is provided for gates of a digital flip-flop circuit. The latching apparatus comprises a feedback circuit which assures that a change in output states, once initiated by a proper triggering signal, will be completed even if the triggering signal quickly disappears. In the logic flip-flop circuit the latching system provides an appropriate digital signal to a gate. This prevents the output terminals of the flip-flop from changing state on subsequent pulses to the same gate without an intervening signal being applied to the other input terminal. Because of the nature of the flip-flop circuit, a relatively fast pulse, that is, one which quickly appears and then disappears, on an appropriate input terminal can cause a relatively long-term change in status for the output terminals, at least until another input terminal is properly actuated. However, it is recognized that random noise, which may exist on the input terminal because of electromagnetic phenomenon or anomalies of the power supply regulation can cause undesired switching of the outputs of the flip-flop. This is because the flip-flop cannot distinguish between a random, undesired, relatively fast noise pulse and a true triggering pulse. It would be desirable therefore if means could be provided for distinguishing between noise signals and true triggering signals for a flip-flop.

SUMMARY OF THE INVENTION

In accordance with the invention it is recognized that in most instances it is not necessary to change the status of the flip-flop with a relatively fast triggering pulse, that is to say that the triggering pulse can be purposely stretched out or extended in time beyond the maximum pulse width of expected noise signals. With this in mind an internal RC timing network may be provided which delays the propagation of a signal through the flip-flop after a triggering operation has begun. The delay is shorter than the expected time of a valid triggering pulse but longer than the expected time of an undesirable noise pulse. Consequently, if the input signal at an appropriate gate of the flip-flop is a true triggering signal, it will remain there longer than the previously mentioned delay time and thus be propagated through the flip-flop for changing the state thereof. If on the other hand, if the triggering signal is a noise signal, each pulse thereof will change level before the delay time has expired. A discharge network is provided to quickly discharge the capacitor of the time delay network when the input pulse disappears. If the input pulse disappears or ceases before the capacitor has charged to a voltage value sufficient to change the output of the flip-flop, all of the charge therein will be quickly discharged through the discharge circuit and the flip-flop will not change state. This has the property of giving the flip-flop a high degree of noise immunity.

BRIEF DESCRIPTION OF THE DRAWING

For a bettwer understanding of the invention, reference may be had to the single FIGURE thereof shown in the accompanying drawing in which a noise immune set-reset flip-flop is depicted.

Referring now to the FIGURE, a set-reset flip-flop TMR is shown. This highly noise immune flip-flop TMR may be constructed from two NAND gates. The flip-flop TMR may be slowed by a filter FILT comprising resistors R7, R8, diode D5 and capacitor CD to prevent latch on noise from affecting the outputs Q, for example. The flip-flop TMR comprises a first NAND gate NAND 1 which is connected through the resistive element R7 to the top of capacitor CD the bottom of which is connected to ground or system common. The cathode of diode D5 is connected to the output of gate NAND 1 its anode is connected to one end of resistive element R8, the other end of resistive element R8 is connected to the common point between resistive element R7 and capacitive element CD. The junction between the resistive element R7 and the capacitor element CD is also connected to one of the input terminals of the NAND gate NAND 2. The other input terminal of gate NAND 2 is the reset terminal RES of the flip-flop TMR. The output terminal of gate NAND 2 is connected to an input terminal of gate NAND 1. The other input terminal of gate NAND 1 is the SET terminal of the flip-flop TMR. The output of gate NAND 2 is also connected to the output terminal Q to provide an output signal TM. As was previously described a triggering signal LD1 may be provided to the SET input terminal of gate NAND 1 and a triggering signal RTC may be provided to the reset terminal RES of gate NAND 2. The triggering input signal LD1 is transferred to the output of the NAND gate NAND 2 with some time delay caused by the filter FILT.

The flip-flop TMR described does not latch "on" if, for example, noise signals are received at its SET input unless the wavelength of the noise wave is comparable to the time constant defined by resistor R7 and capacitor CD. Noise immunity is achieved because in the shown configuration of FILT the average voltage on capacitor CD is always less than the mean (dc) value of the output signal of gate NAND 1 for an expected frequency range of noise inputs signals. Capacitor CD quickly discharges through diode D5 and resistor R8. Without resistor R8 and diode D5 the memory TMR would likely latch "on" even before it reached its above-described final mean (dc) value.

It is to be understood with respect to the embodiments of the invention that the concepts shown with respect to the single FIGURE can be used with NOR gates as well as NAND gates and can be used with negative going logic rather than positive going logic where the capacitor CD may charge when the output of the gate is in the status of a digital zero and discharge when the output of the gate is in the status of a digital one.

The apparatus taught with respect to the embodiment of this invention as many advantages. One advantage lies in the fact that the circuit exhibits a high degree of noise immunity.

What we claim as our invention is:

1. A set-reset flip-flop, comprising:
   gate means, the set input terminal of said flip-flop being connected to an input terminal of said gate means, said gate means having an output terminal at which a logic level appears in response to the occurrence of a triggering signal at said set input terminal, the duration of said logic level and said triggering signal being substantially the same;
   delay means for delaying for a predetermined period of time a logic level which appears on the input terminal thereof from appearing on the output terminal thereof, said input terminal of said delay means being connected to said output terminal of said gate means, said output terminal of said delay means comprising an output and cross-coupling terminal of said flip-flop, said delay means comprising resistive means and capacitive means connected together in integrating circuit relationship for effecting said delay as a function of the charging time constant thereof and said logic level, said output and cross-coupling terminal disposed between said resistive means and said capacitive means; and
   discharge means interconnected with said terminal for discharging said capacitive means with a time constant which is smaller than said charging time constant, said charging time constant representing a time which is shorter than the duration of a desired triggering signal but larger than the expected duration of an undesired noise pulse on said set input terminal to thus allow said desired triggering signal to change the logic level at said output of said flip-flop after said predetermined time but to prevent said undesired noise pulse from changing said logic level at said output of said flip-flop.

2. A set-reset flip-flop, comprising:
   gate means, the set input terminal of said flip-flop being connected to an input terminal of said gate means, said gate means having an output terminal at which a logic level appears in response to the occurrence of a triggering signal at said set input terminal, the duration of said logic level and said triggering signal being substantially the same;
   delay means for delaying for a predetermined period of time a logic level which appears on the input terminal thereof from appearing on the output terminal thereof, said input terminal of said delay means being connected to said output terminal of said gate means, said output terminal of said delay means comprising an output and cross-coupling terminal of said flip-flop, said delay means comprising resistive means and capacitive means connected together in integrating circuit relationship for effecting said delay as a function of the discharging time constant thereof and said logic level, said output and cross-coupling terminal disposed between said resistive means and said capacitive means; and
   charge means interconnected with said terminal for charging said capacitive means with a time constant which is smaller than said discharging time constant, said discharging time constant representing a time which is shorter than the duration of a desired triggering signal but larger than the expected duration of an undesired noise pulse on said set input terminal to thus allow said desired triggering signal to change the logic level at said output of said flip-flop after said predetermined time but to prevent said undesired noise pulse from changing said logic level at said output of said flip-flop.

3. A set-reset flip-flop, comprising:
   gate means, the reset input terminal of said flip-flop being connected to an input terminal of said gate means, said gate means having an output terminal at which a logic level appears in response to the occurrence of a triggering signal at said reset input terminal, the duration of said logic level and said triggering signal being substantially the same;
   delay means for delaying for a predetermined period of time a logic level which appears on the input terminal thereof from appearing on the output terminal thereof, said input terminal of said delay means being connected to said output terminal of said gate means, said output terminal of said delay means comprising an output and cross-coupling terminal of said flip-flop, said delay means comprising resistive means and capacitive means connected together in integrating circuit relationship for effecting said delay as a function of the charging time constant thereof and said logic level, said output and cross-coupling terminal disposed between said resistive means and said capacitive means; and
   discharge means interconnected with said terminal for discharging said capacitive means with a time constant which is smaller than said charging time constant, said charging time constant representing a time which is shorter than the duration of a desired triggering signal but larger than the expected duration of an undesired noise pulse on said reset input terminal to thus allow said desired triggering signal to change the logic level at said output of said flip-flop after said predetermined time but to prevent said undesired noise pulse from changing said logic level at said output of said flip-flop.

4. A set-reset flip-flop, comprising:
   gate means, the reset input terminal of said flip-flop being connected to an input terminal of said gate means, said gate means having an output terminal at which a logic level appears in response to the occurrence of a triggering signal at said reset input terminal, the duration of said logic level and said triggering signal being substantially the same;

delay means for delaying for a predetermined period of time a logic level which appears on the input terminal thereof from appearing on the output terminal thereof, said input terminal of said delay means being connected to said output terminal of said gate means, said output terminal of said delay means comprising an output and cross-coupling terminal of said flip-flop, said delay means comprising resistive means and capacitive means connected together in integrating circuit relationship for effecting said delay as a function of the discharging time constant thereof and said logic level, said output and cross-coupling terminal disposed between said resistive means and said capacitive means; and charge means interconnected with said terminal for charging said capacitive means with a time constant which is smaller than said discharging time constant, said discharging time constant representing a time which is shorter than the duration of a desired triggering signal but larger than the expected duration of an undesired noise pulse on said reset input terminal to thus allow said desired triggering signal to change the logic level at said output of said flip-flop after said predetermined time but to prevent said undesired noise pulse from changing said logic level at said output of said flip-flop.

* * * * *